(12) United States Patent
Manku

(10) Patent No.: US 6,232,848 B1
(45) Date of Patent: May 15, 2001

(54) LOW VOLTAGE TOPOLOGY FOR RADIO FREQUENCY INTEGRATED CIRCUIT DESIGN

(75) Inventor: Tajinder Manku, Kitchener (CA)

(73) Assignee: The University of Waterloo, Waterloo (CA)

( * ) Notice: Subject to any disclaimer, the term of this patent is extended or adjusted under 35 U.S.C. 154(b) by 0 days.

(21) Appl. No.: 09/213,361

(22) Filed: Dec. 17, 1998

(30) Foreign Application Priority Data

Dec. 16, 1997 (CA) .................................................. 2224953

(51) Int. Cl.$^7$ ...................................................... H03H 5/00
(52) U.S. Cl. ......................................... 333/24 R; 333/176
(58) Field of Search ............................... 333/24 R, 24 C, 333/176; 330/302

(56) References Cited

U.S. PATENT DOCUMENTS 5,301,361 * 4/1994 Koike ..................................... 455/95

OTHER PUBLICATIONS

Derek K. Shaeffer et al., "A 1.5–V, 1.5–GHz CMOS Low noise Amplifier," IEEE Journal of Solide–State Circuits, vol. 32, No. 5, May 1997.

P.J. Sullivan et al., "Low Voltage Performance of a Microwave SMOS Gilbert Cell Mixerr," IEEE Journal of Solid––State Circtuis, vol. 32, No. 7, Jul. 1997.

Andrew N. Karanicolas, "A 2.7V 900MHz CMOS LNA and Mixer", 1996 IEEE International Solid–State Circuits Conference, Feb. 8, 1996.

Ahmadreza Rofougaran et al., "A 1 GHz CMOS RF Front-End IC for a Direct–Conversion Wireless Receiver," IEEE Journal of Solid–State Circuits, vol. 31, No. 7, Jul. 1996.

Behzad Razavi, "A 1.5V 900MHz Downcoversion Mixer", 1996 IEEE International Solid–State Circuits Conference, Feb. 8, 1996.

Behzad Razavi, "Design Consideration for Direct–Conversion Receivers," IEEE Transactions on Circuits and Systems–11:Analog and Digital Signal Processing, vol. 44, No. 6, Jun. 1997.

John R. Long et al., "A 1.9 GHz Low–Voltage Silicon Bipolar Receiver Front–End for Wireless Personal Communications Systems", IEEE Journal of Solid–State Circuits, vol. 30, No. 12, Dec. 1995.

Ed Callaway, "1–Volt RF Circuit Design for Pagers," AACD, 1998.

\* cited by examiner

Primary Examiner—Robert Pascal
Assistant Examiner—Kimberly E Glenn
(74) Attorney, Agent, or Firm—Sim & McBurney

(57) ABSTRACT

An integrated radio frequency (RF) coupling scheme is provided for realizing low voltage RF integrated circuits. According to the invention, on-chip capacitively coupled resonant elements are used to DC isolate circuit block elements which are required to be connected in series and share a common DC current. The coupling scheme according to the present invention may be applied to several commonly used RF integrated circuit topologies such as low noise amplifiers and mixers.

5 Claims, 8 Drawing Sheets

LOW VOLTAGE TOPOLOGY FOR RADIO FREQUENCY INTEGRATED CIRCUIT DESIGN

FIELD OF THE INVENTION

The present invention relates in general to radio frequency (RF) circuits, and more particularly to an integrated RF coupling topology using on-chip capacitively coupled resonant elements to DC isolate circuit block elements which are required to be connected in series and share a common DC current.

BACKGROUND OF THE INVENTION

The era of wireless communications is expanding at an unprecedented rate with the introduction of PCS (Personal Communication System) devices into the consumer market. The key issues involved in designing wireless systems are (i) integrating the digital base band subsystem with a high frequency analogue front end, and (ii) ensuring low voltage/power.

Presently, the majority of RC integrated circuits (IC's) are implemented using GaAs and bipolar technology, whereas the base band subsystems are implemented using CMOS technology. A significant amount of research is being expended towards developing RF IC's using CMOS technology (see A. N. Karanicolas, "A2.7V 900 MHz LNA and mixer," Proc. IEEE Inter. Solid-State Circuits Conference, 1996 and A. Rofourgaran, J. Y. C. Chang, M. Rofougaran, and A. A. Abidi, "A IGHz CMOS RF front-end IC for a direct-conversion wireless receiver," IEEE J. of Solid State Circuits, vol. 31, no. 7, pp. 880–889, July 1996).

Many of the recently developed CMOS circuits have the ability of operating with voltages as low as from 1.5 to 2.0 V. (see (1) D. K. Schaeffer and T. H. Lee, "A 1.5V, 1.5 GHz CMOS low noise amplifier," IEEE J. of Solid State Circuits, vol. 32, no. 5, pp. 745–759, May 1997; (2) P. J. Sullivan, B. A. Xavier and W. H. Ku, "Low voltage performance of a microwave CMOS Gilbert cell mixer," IEEE J. of Solid State Circuits, vol. 32, no. 7, pp. 1151–1155, July 1997; (3) B. Razavi, "A 1.5V 900 MHz down-conversion mixer," ISSCC Dig. Tech. Paper, February 1996, pp. 48–49; and (4) B. Razavi, "Design Considerations for Direct-Considerations for Direct-Conversion Receivers," IEEE Trans, on Circuits and Systems-II: Analog and Digital Signal Processing, vol. 44, no. 6, pp. 428–435, 1997).

Some effort has also been expended in the art to reduce the voltage supply for bipolar based technologies. In the work by Long, J. R. Lone and M. A. Copeland, "A 1.9 GHz low voltage silicon bipolar receiver front-end for wireless personal communications systems," IEEE J. of Solid State Circuits, vol. 30, no. 12, pp. 1428–1448, on-chip transformers are used to reduce the amount of DC head room required between the power rails.

SUMMARY OF THE INVENTION

According to the present invention, a low voltage topology is provided for DC isolating circuit elements which are normally connected in series and which share a common DC current. The topology of the present invention uses no on-chip transformers to reduce the voltage supply as in the prior art but instead uses capacitively coupled LC tanks.

BRIEF DESCRIPTION OF THE DRAWINGS

Detailed description of the preferred embodiment is provided herein below with reference to the following drawings, in which.

DETAILED DESCRIPTION OF THE PREFERRED EMBODIMENT

Figure 1:
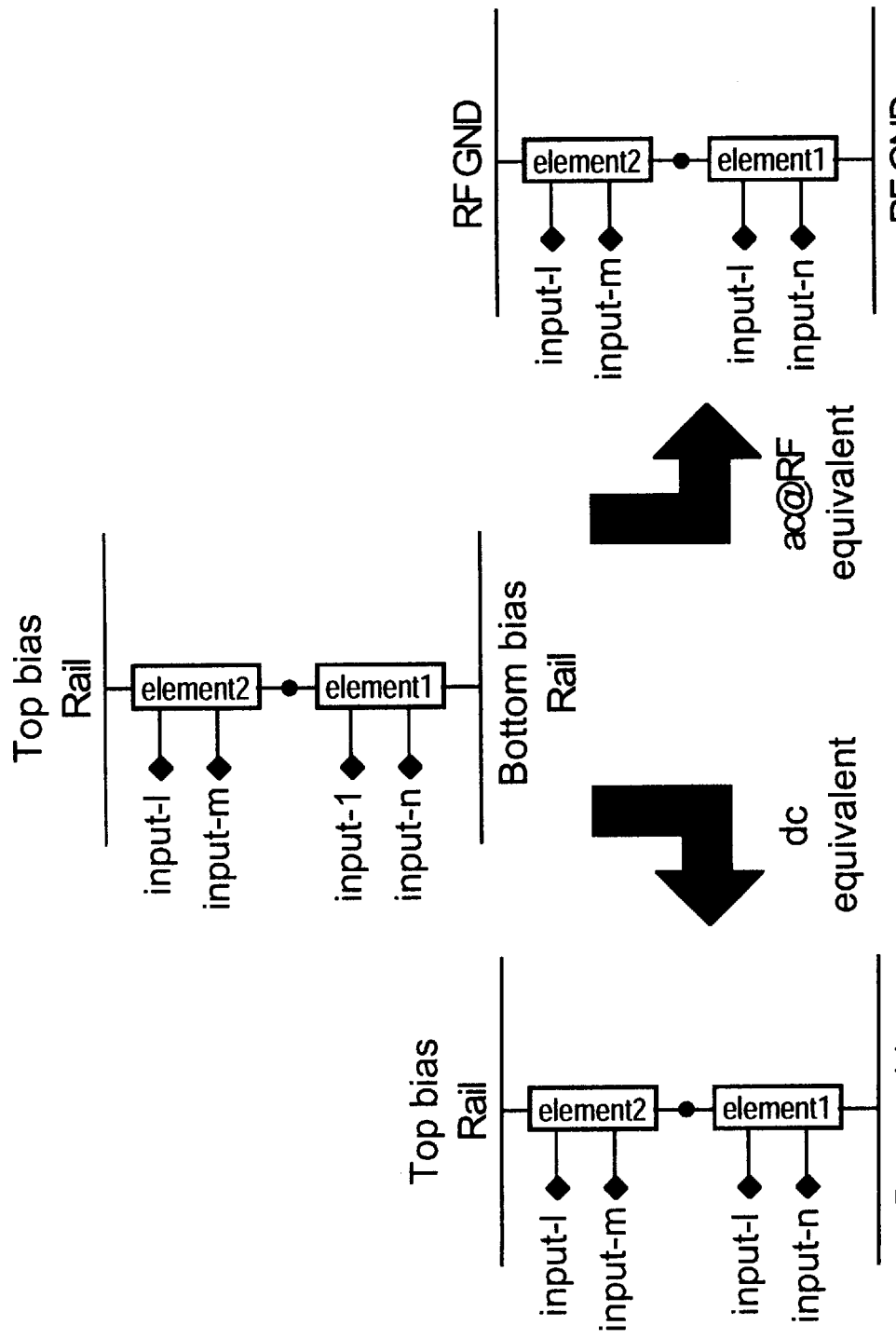
FIG. 1 is a block schematic diagram showing two element blocks connected in series between the voltage rails in a typical prior art arrangement, along with the DC and AC equivalent circuits therefore.

Many RFIC functional elements (LNA's and mixers) use DC current sharing to realize required biasing, functionality, and/or performance. In FIG. 1, two circuit element blocks (element 1 and element 2) are shown connected in series between a pair of DC voltage rails (top bias rail and bottom bias rail). Each element consists of at least one active component and several passive components. In order to bias each element, a minimum voltage of $V_{on}$ is required to turn on all electrical components within each element. Therefore, a bias voltage of $2V_{on}$ is required to turn on both elements.

The DC and AC equivalent circuits of FIG. 1 are shown at the bottom left and right of the circuit, respectively. It will be observed that both circuits appear identical except that the DC nodes of the DC equivalent circuit are replaced by AC ground nodes in the AC equivalent circuit. According to the AC equivalent circuit, RF signals are permitted to pass between elements, which is required for functionality.

Figure 2B:
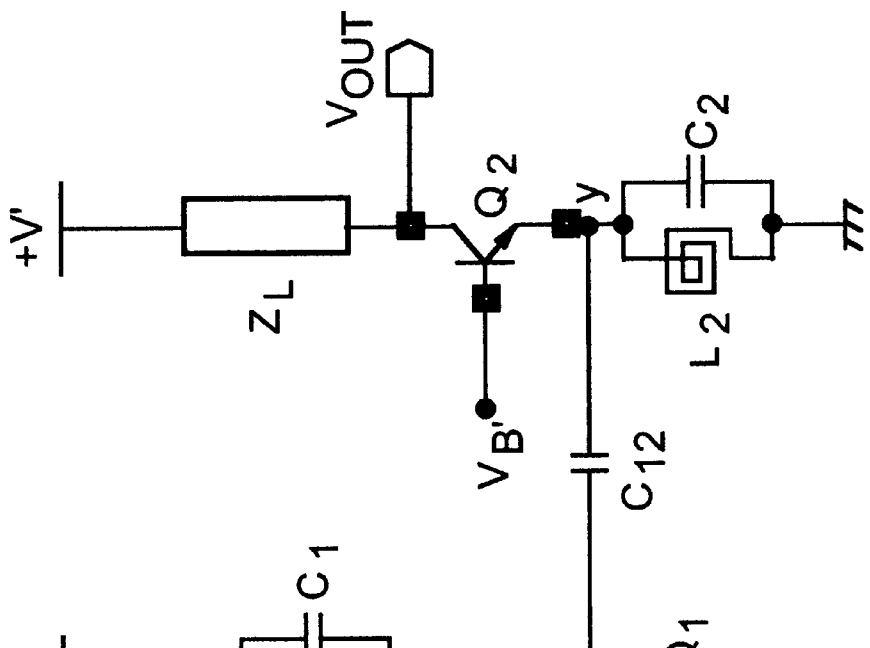
FIG. 2a shows a classical cascode amplifier using bipolar devices and FIG. 2b shows a new cascode amplifier design using capacitively coupled LC tanks in accordance with the present invention.
Figure 2A:
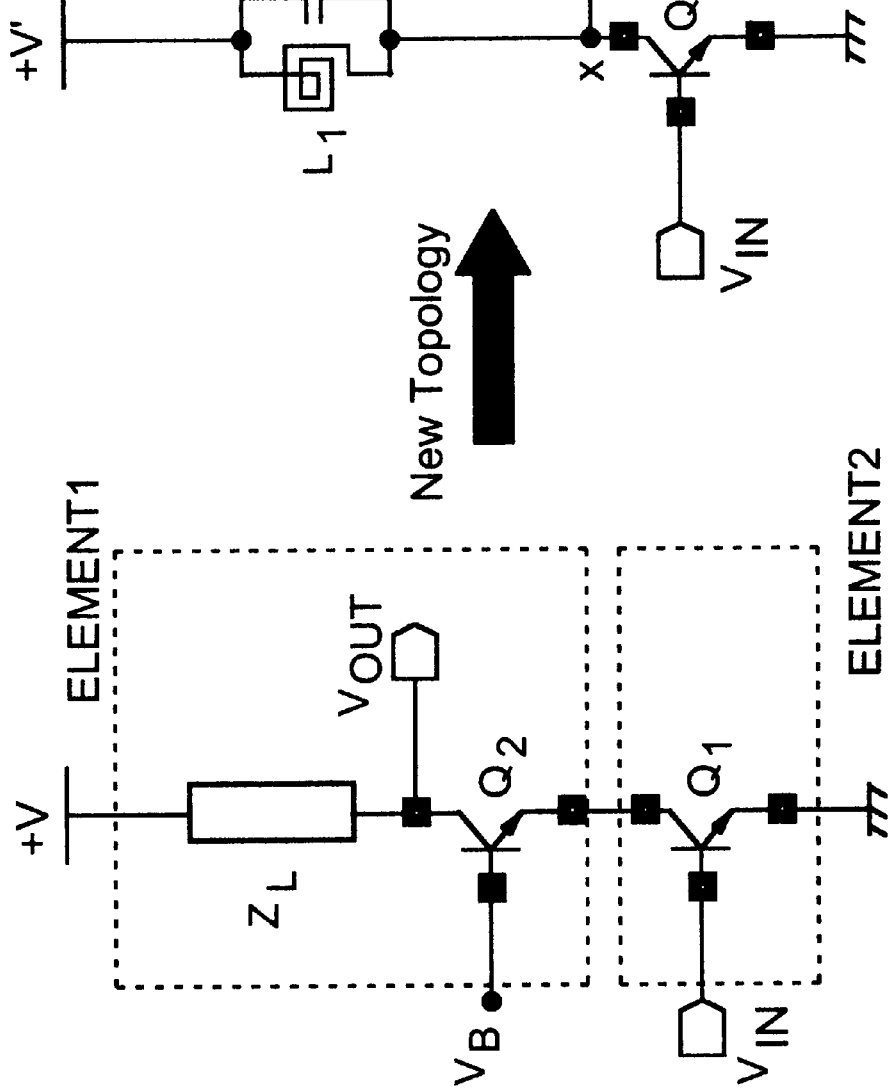

One example of such a prior art element is a cascode RF amplifier as shown in FIG. 2a. This particular amplifier requires two stacked transistor (Q1 and Q2) for functionality. The cascode structure helps increase stability and allow for simultaneous matched inputs (VIN and VB) for both noise and impedance. If each transistor has a turn on voltage $V_{on} \approx 0.8V$ (i.e. the turn on voltage of a BJT), the absolute minimum supply voltage required is 1.6V. For a classic cascode amplifier, both DC and AC currents are shared between the two elements (i.e. element 1 presents a load impedance caused by ZL combined with transistor Q2 while element 2 presents a load impedance resulting from transistor Q1). The inventor has recognized that if the AC and DC portions of the circuit are decoupled, it is possible to reduce the required power supply voltage.

Figure 3:
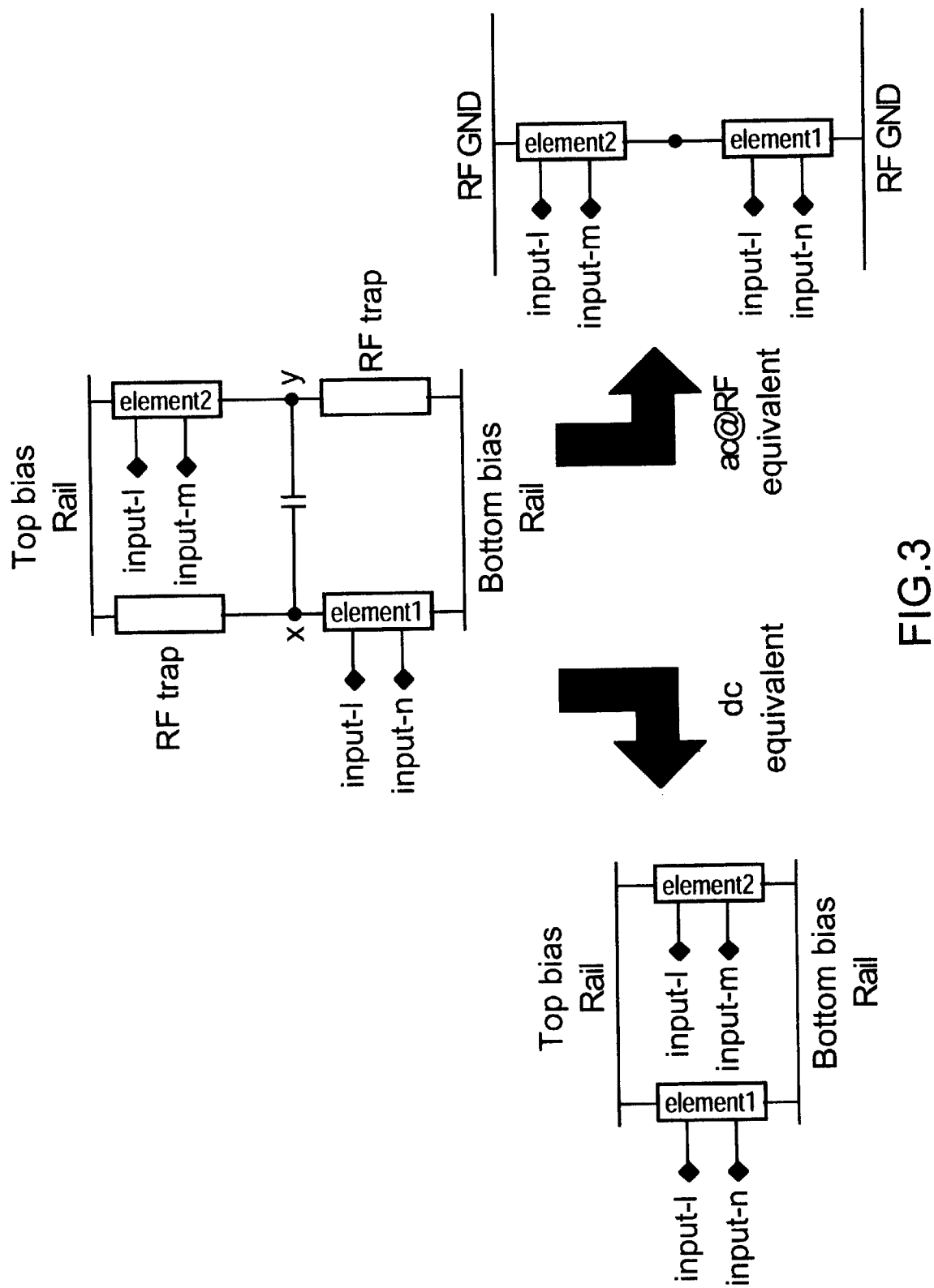
FIG. 3 shows the new topology according to a preferred embodiment of the present invention using capacitively coupled RF traps to isolate DC biasing from RF signals.

In FIG. 3, a preferred embodiment of the proposed decoupling topology according to the present invention is shown using on-chip RF traps and one coupling (i.e. bypass)

capacitor. The function of each RF trap is to provide a low impedance across its terminal at DC and a relatively high impedance at RF. The RF traps can also be designed such that they couple the RF signal between element 1 and element 2, as discussed in grater detail below with reference to FIG. 8. The meaning of "relatively high" is elaborated upon below with reference to actual examples. The function of the coupling capacitor is to couple the RF signal between the two elements. In the arrangement of the present invention, there is no DC current sharing between the two elements because of the coupling capacitor. Furthermore, since the RF trap requires no DC head room, the minimum voltage supply required is on $V_{on}$ and not $2V_{on}$ as in the prior art. The equivalent DC circuit is illustrated to the bottom left of FIG. 3. At radio frequencies, the trapping elements essentially become open circuits and the coupling capacitor couples the RF signal between the two elements (elements 1 and 2). The equivalent RF circuit is shown to the bottom right of FIG. 3.

Returning to FIG. 2b, the topology of the present invention is shown applied to a cascode amplifier. The two transistors are DC decoupled by the coupling capacitor, and are RF coupled by the RF trap in conjunction with the coupling capacitor. If each transistor has a turn on voltage $V_{on} \approx 0.8V$ (i.e. the turn on voltage of a BJT) the absolute minimum supply voltage is 0.8V However, it will be noted that the total DC power will remain approximately the same as in the classic cascode configuration of FIG. 2a.

Figure 4:
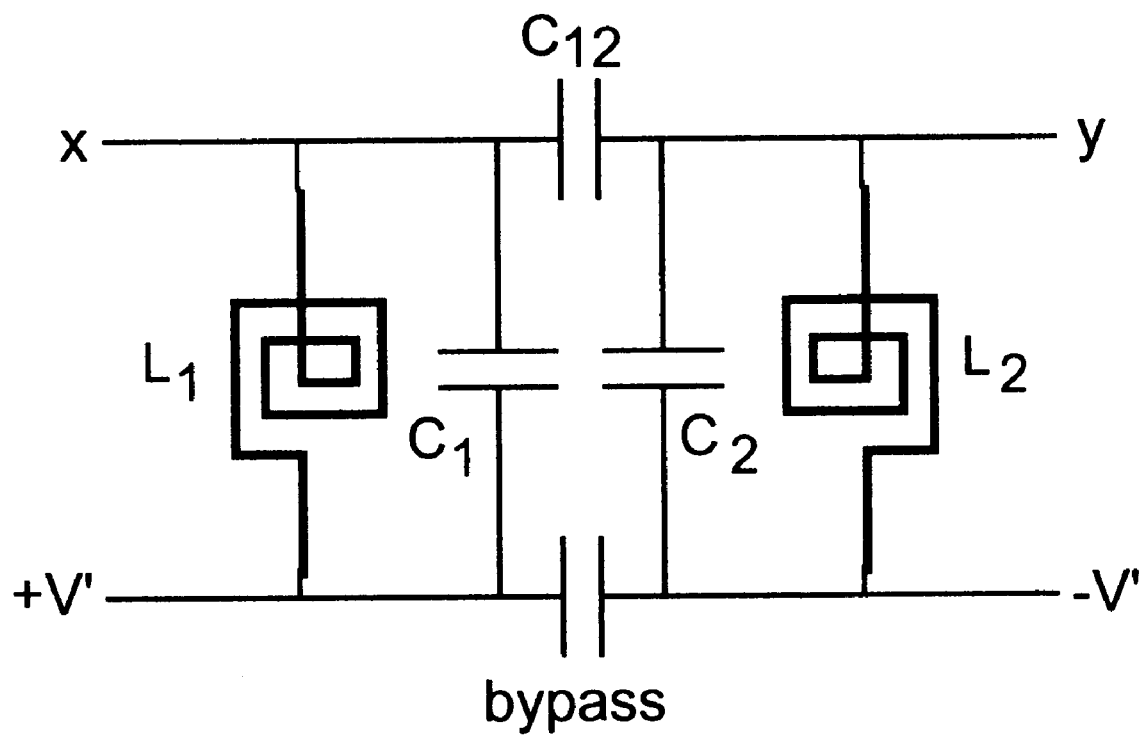
FIG. 4 shows a proposed layout topology for the two LC structures of FIG 2b.

The on-chip RF trap of the preferred embodiment shown in FIG. 3, can be realized using an on-chip LC tank circuit, as illustrated in FIG. 4. The inductance consists of on-chip spiral inductors L1 and L2, while the capacitance is provided by capacitors C1 and C2. The bypass capacitor shown in FIG. 4 represents the separation between the top and bottom DC power rails. Since on-chip inductors have relatively low Q-values, the LC tank may have a relatively low impedance at resonance (i.e. at RF) which can in some applications degrade performance.

Figure 5A:
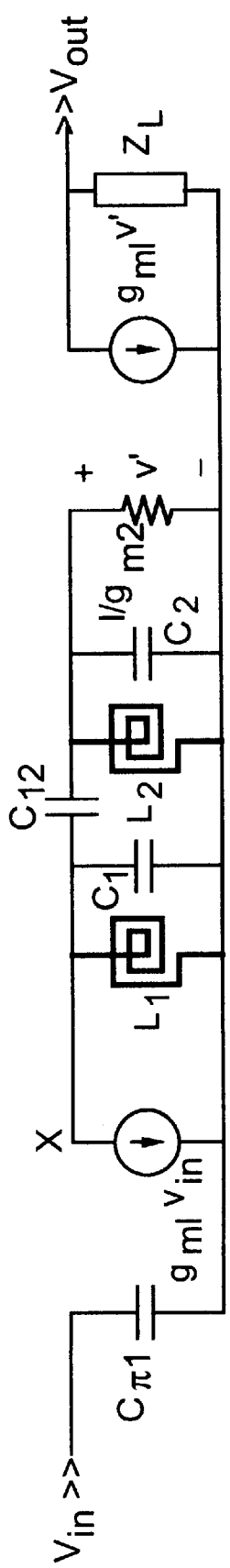
FIG. 5a is a small signal circuit of a cascode structure using the new topology of the present invention.
Figure 5B:
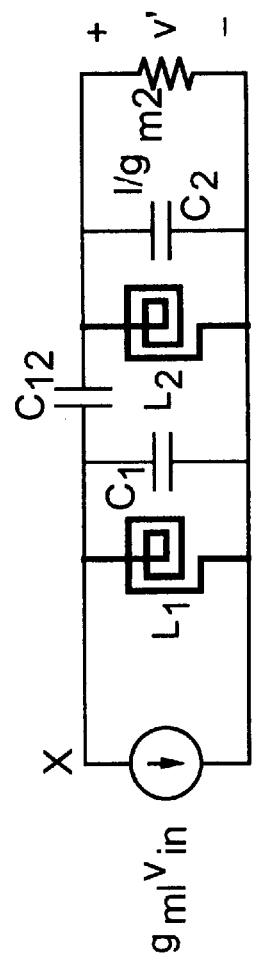
FIG. 5b is the equivalent circuit of the cascode structure of FIG. 5a showing the coupling elements.
Figure 5C:
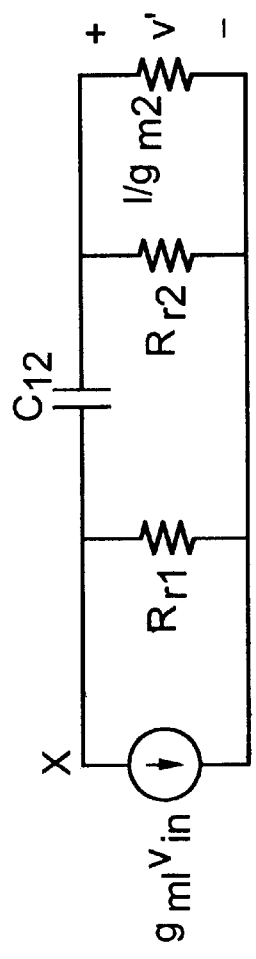
FIG. 5c is the equivalent circuit of the cascode structure of FIG. 5a showing the coupling elements at resonance.

In order to understand the design criteria necessary for circuit functionality of the present invention, a typical cascode circuit is analyzed herein below since most receiver RF integrated circuits (i.e. LNA's and mixers) can be represented in a cascode form. In FIG. 5a, the small equivalent circuit of a cascode amplifier is depicted using the new topology according to the present invention. In order for the circuit to operate correctly, two basic conditions have to be met: (i) all of the transconductance current generated by M1 (i.e. $g_{m1}v_{in}$) should be fed into $1/g_{m2}$ (i.e. the transconductance resistance of M2); and (ii) the gain at node X, relative to the input voltage should be near unity (this is required to reduce the overall Miller effect). For the present analysis, only the coupling circuitry needs to be considered since it is isolated from the rest of the circuit. In FIG. 5b, an equivalent network representation is depicted of the coupling circuitry. In order for the input current (i.e. $g_{m1}v_{in}$) to drive the output resistance (i.e. $1/g_{m2}$) at RF, the LC stands are required to resonate at the RF frequency. However, since the Q's of the inductors are finite in value, the resistance of the LC network is also finite in value at resonance. The equivalent resistance at resonance of the LC tanks is given by, $$R_{r1} = R_1(1+Q_1^2) \quad (1)$$

$$R_{r2} = R_2(1+Q_2^2) \quad (2)$$

where $R_1$ and $R_2$ represent the resistance of the inductors $L_1$ and $L_2$ at RF, respectively, and $R_{r1}$ and $R_{r2}$ denote the resistances of the $LC_1$ and $LC_2$ tanks at resonance, respectively. In FIG. 5c the network is depicted in the resonance condition. For the circuit to function adequately, $$R_{r1} \gg \frac{1}{\omega_0 C_{12}} \quad (3)$$

$$R_{r2} \gg \frac{1}{g_{m2}} \quad (4)$$

If the LC tanks are not made to resonate at the RF frequency, then more generalized conditions apply, as follows:

$$\left| \frac{1}{R_1(1+Q_1^2)} + j\frac{\omega_0 C_1 R_1^2 - \omega_0 L_1 + \omega_0^3 L_1^2 C_1}{R_1^2 + \omega_0^2 L_1^2} \right| \ll \omega_0 C_{12} \quad (5)$$

$$\left| \frac{1}{R_1(1+Q_2^2)} + j\frac{\omega_0 C_2 R_2^2 - \omega_0 L_2 + \omega_0^3 L_2^2 C_2}{R_2^2 + \omega_0^2 L_2^2} \right| \ll g_{m2} \quad (6)$$

Using typical values, the results in Equations (5) and (6) can be predicted. For an RF frequency of 2 GHz, and inductors of 4nH with Q's of 5, then $$R_{r1} = R_{r2} = 250 \, \omega$$

Therefore $$C_{12} \gg 3pf$$

$$g_{m2} \gg 4mS$$

Both of the above conditions are easily satisfied in either a bipolar or CMOS based technology environment. For a bipolar device, the condition $g_{m2} \gg 4mS$ results in a collector current greater than 0.1 mA.

Figure 6:
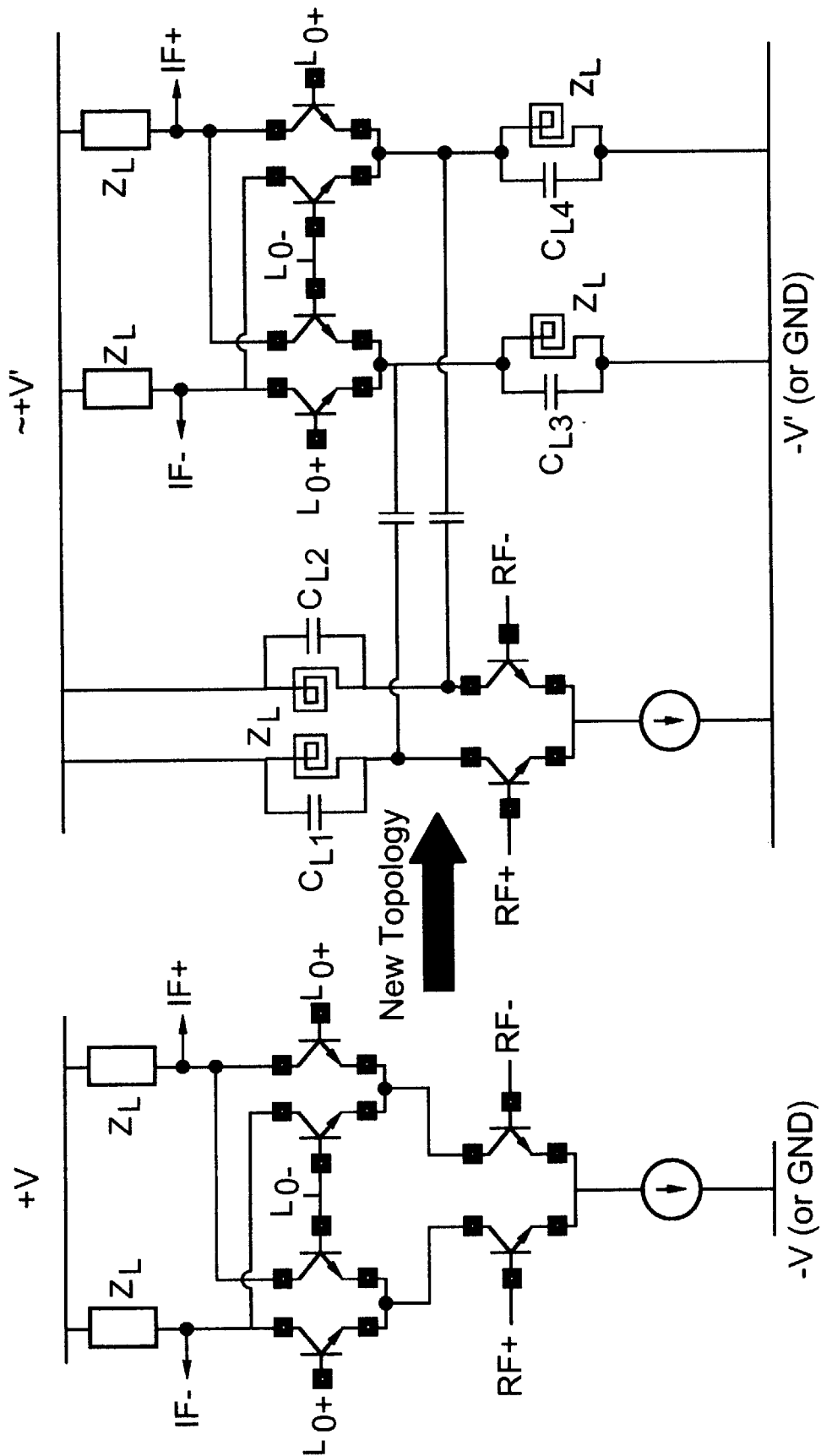
FIG. 6 is a schematic diagram of a low voltage version of a Gilbert mixer implemented using the topology of the present invention.

The decoupling topology can also be applied to a standard Gilbert mixer. The topology of the present invention as applied to a Gilbert mixer is shown on the right side portion of FIG. 6, along with its standard prior art counterpart depicted to the left. The same basic conditions as outlined in equations (5) and (6) need to be satisfied, $$R_1(1+Q_1^2) \gg \frac{1}{\omega_0 C_{12}} \quad (7)$$

$$R_2(1+Q_2^2) \gg \frac{1}{g_{m3,m4,m5,m6}}\bigg|_{on} \quad (8)$$

Figure 7:
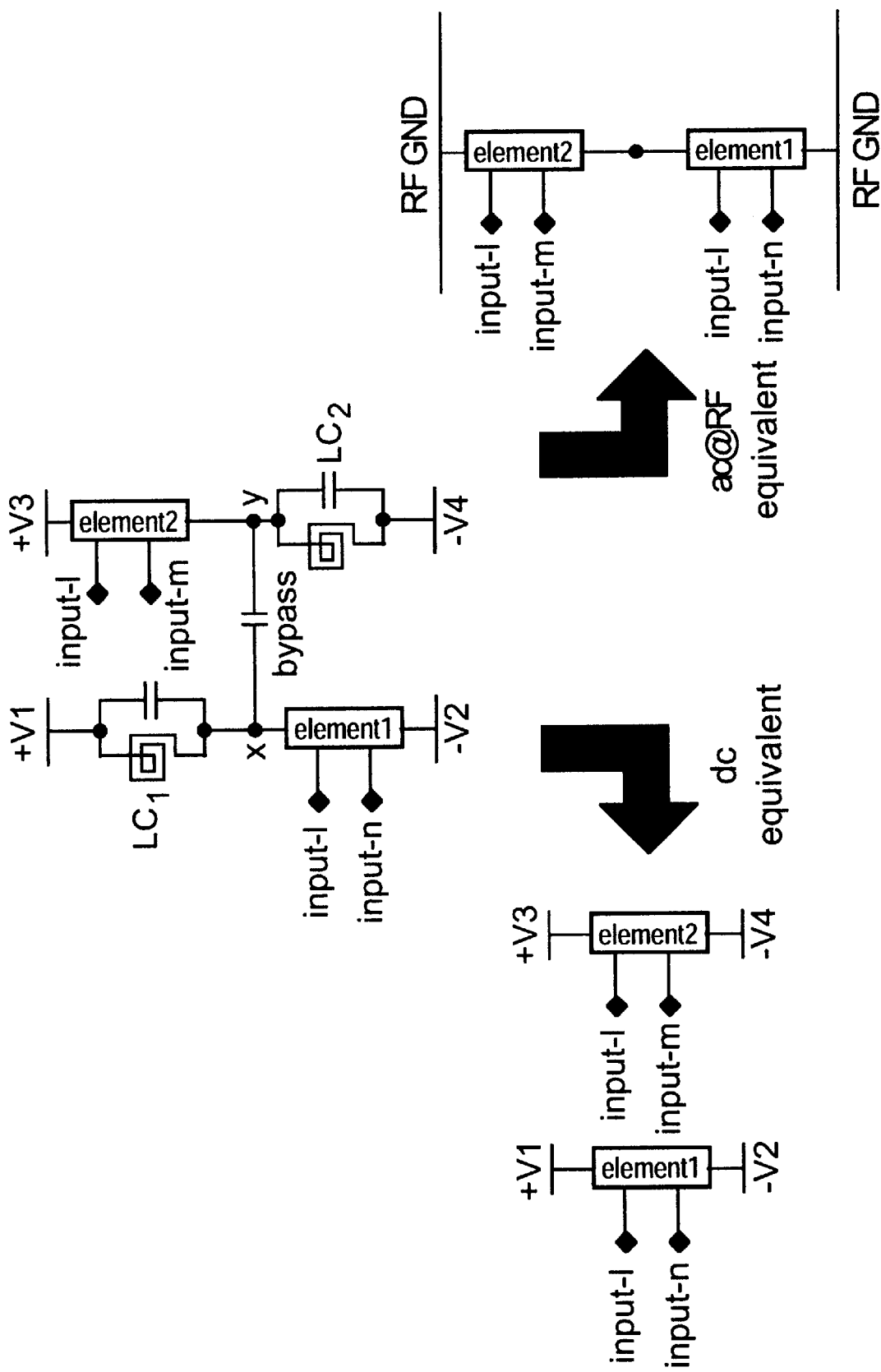
FIG. 7 shows the new topology according to an alternative embodiment wherein two different power supplies are provided.

According to the alternative embodiment of FIG. 7, the supply voltage applied to each of the elements (Element 1 and Element 2) are different. Specifically, a voltage of V1+V2 is applied to Element 1 and a supply voltage of V3+V4 is applied to Element 2. In all other respects, operation of the circuit is identical to the preferred embodiment set forth above.

Figure 8:
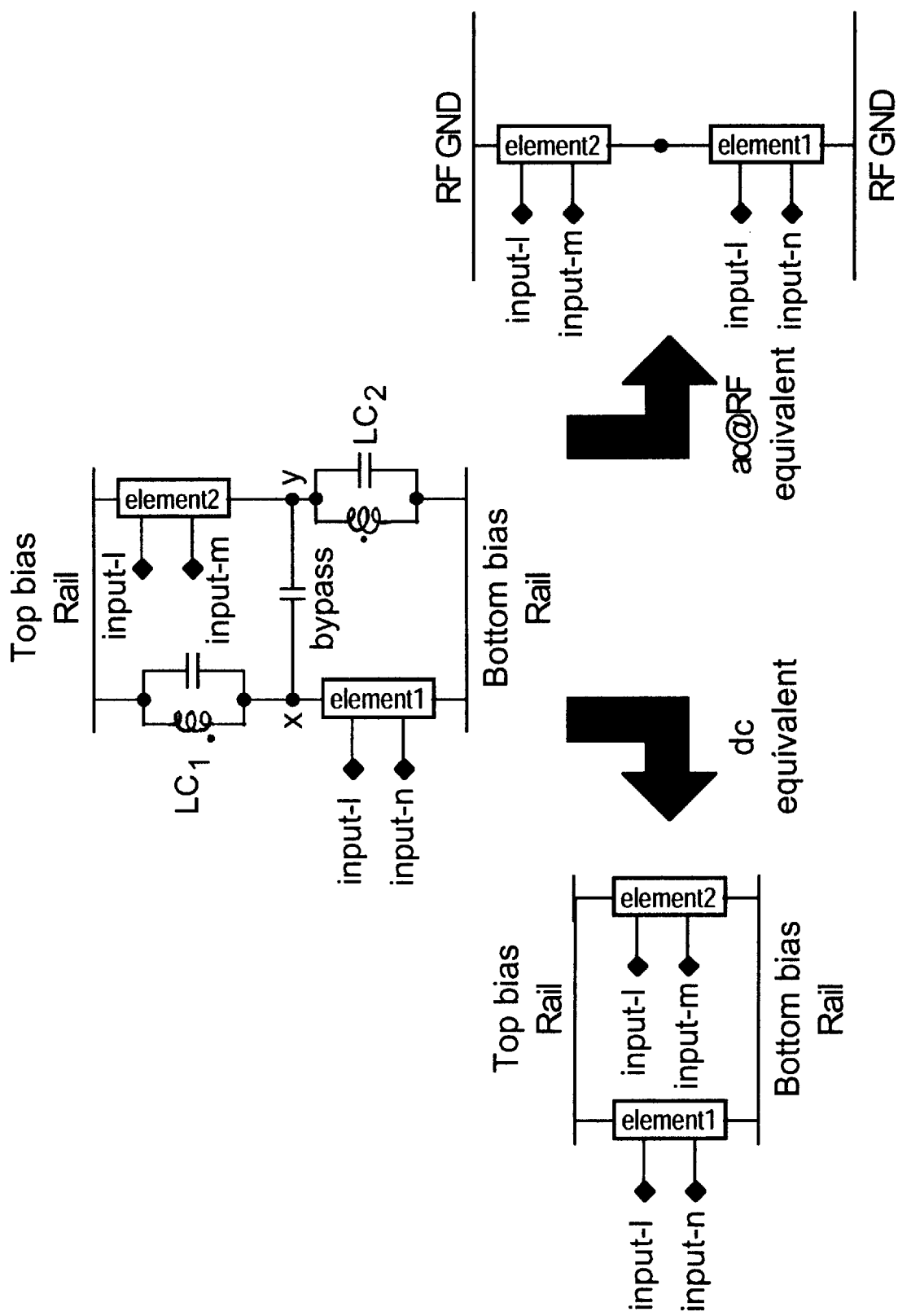
FIG. 8 shows the new topology according to a further alternative embodiment using mutual coupled LC tanks.

The RF traps in FIG. 3 can be replaced by inductively coupled LC tanks as discussed above with reference to FIG. 4. The inductively coupled LC tanks can, for example, be implemented as an integrated micro-transformer as shown in FIG. 8.

One advantage of the low voltage topology according to the present invention is that the collector emitter (or drain current for a MOSFET) of each transistor (Q1 and Q2) can be independently controlled. The either reduces the noise figure, increases linearity, or both. Another advantage of the capacitively coupled resonating circuit according to the present invention can be used to satisfy filtering requirements imposed on the circuit by system specifications.

In summary, according to the present invention, a new on-chip topology is provided for low voltage RF IC's. The basic criteria for implementing the circuit may be applied to cascode amplifiers and Gilbert mixers as well as other RF integrated circuits.

Other embodiments and modifications of the invention are possible within the sphere and scope of one or more of the claims appended hereto.

I claim:

1. In an RF circuit having first and second circuit element blocks connected in series between first and second DC bias rails, the improvement comprising:

an RF coupling capacitor connected in series between said first and second circuit element blocks;

a first DC coupling RF trap connected in series between said first DC bias rail and a first node connecting said RF coupling capacitor and said first circuit element block; and a second DC coupling RF trap connected in series between said DC bias rail and a second node connecting said RF coupling capacitor and said second circuit element block, wherein each of said first and second DC coupling RF traps comprises an LC tank circuit, and wherein said LC tank circuit further comprises a spiral inductor connected in parallel with a first capacitor.

2. In an RF circuit having a first circuit element block connected between first and second DC bias rails and a second circuit element block connected between third and fourth DC bias rails, the improvement comprising:

an RF coupling capacitor connected in series between said first and second circuit element blocks;

a first DC coupling RF trap connected in series between said first DC bias rail and a fist node connecting said RF coupling capacitor and said first circuit element block; and a second DC coupling RF trap connected in series between said fourth DC bias rail and a second node connecting said RF coupling capacitor and said second circuit element block.

3. In an RF circuit having a first circuit element block connected between first and second DC bias rails and a second circuit element block connected between third and fourth DC bias rails, the improvement comprising:

a first RF trap connected in series between said first DC bias rail said first circuit element block; and a second RF trap mutually coupled to said first RF trap and connected in series between said fourth DC bias rail and said second circuit element block.

4. The improvement of claim 3 wherein said first and second RF traps are mutually coupled LC tanks.

5. In an RF circuit having first and second circuit element blocks connected in series between first and second DC bias rails, the improvement comprising:

a first RF trap connected in series between said first DC bias rail and said first circuit element block; and a second RF trap connected in series between said second DC bias rail and said second circuit element block wherein said first and second RF traps are mutually coupled LC tanks.

* * * * *